(12) United States Patent
Kang et al.

(10) Patent No.: US 12,446,336 B2
(45) Date of Patent: Oct. 14, 2025

(54) CMOS IMAGING SENSOR STRUCTURE AND MANUFACTURING METHOD THEREFOR

(71) Applicants: SHANGHAI IC R&D CENTER CO., LTD., Shanghai (CN); Shanghai Integrated Circuit Equipment & Materials Industry Innovation Center Co., Ltd, Shanghai (CN)

(72) Inventors: Xiaoxu Kang, Shanghai (CN); Ming Li, Shanghai (CN)

(73) Assignees: SHANGHAI IC R&D CENTER CO., LTD., Shanghai (CN); Shanghai Integrated Circuit Equipment & Materials Industry Innovation Center Co. Ltd, Shanghai (CN)

( * ) Notice: Subject to any disclaimer, the term of this patent is extended or adjusted under 35 U.S.C. 154(b) by 223 days.

(21) Appl. No.: 17/432,930

(22) PCT Filed: Oct. 14, 2019

(86) PCT No.: PCT/CN2019/110938
§ 371 (c)(1),
(2) Date: Aug. 22, 2021

(87) PCT Pub. No.: WO2020/168728
PCT Pub. Date: Aug. 27, 2020

(65) Prior Publication Data
US 2024/0413175 A1 Dec. 12, 2024

(30) Foreign Application Priority Data
Feb. 22, 2019 (CN) .......................... 201910133346.1
Mar. 12, 2019 (CN) .......................... 201910183135.9

(51) Int. Cl.
*H10F 39/00* (2025.01)

(52) U.S. Cl.
CPC .......... *H10F 39/802* (2025.01); *H10F 39/026* (2025.01); *H10F 39/807* (2025.01); *H10F 39/811* (2025.01)

(58) Field of Classification Search
CPC ...... H10F 39/18; H10F 39/199; H10F 39/802; H10F 39/8023; H10F 39/8027;
(Continued)

(56) References Cited

U.S. PATENT DOCUMENTS

2015/0061062 A1* 3/2015 Lin ..................... H10F 39/8057
438/69
2016/0086983 A1 3/2016 Bedell et al.
(Continued)

*Primary Examiner* — Scott B Geyer
(74) *Attorney, Agent, or Firm* — Bayramoglu Law Offices LLC (57) ABSTRACT

A CMOS imaging sensor structure and a manufacturing method therefor. The CMOS imaging sensor structure comprises a pixel unit of the CMOS imaging sensor set on a semiconductor substrate, the pixel unit comprises a circuit device region and a first photosensitive region, the circuit device region is set on the frontside of the semiconductor substrate, the first photosensitive region is set correspondingly in the semiconductor substrate below the circuit device region, the circuit device region is isolated from the first photosensitive region by an isolation region, and the circuit device region is electrical connected with the first photosensitive region through a conductive trench, a fill factor of a photosensitive region is increased, and performances of a reading circuit is increased by a more optimized design scheme. A second photosensitive region of the pixel unit can also be set on the semiconductor substrate on a side of the circuit device region, thus a larger photosensitive region can be formed together with the first photosensitive region. The present invention also provides a manufacturing method for the CMOS imaging sensor structure.

19 Claims, 2 Drawing Sheets

(58) Field of Classification Search
CPC .............. H10F 39/807; H10F 39/811; H01L 21/7624–76291; H10D 86/201–215; H10D 62/115–116; H10D 30/667; H10D 30/657

See application file for complete search history.

(56) References Cited

U.S. PATENT DOCUMENTS

| | | | |
|---|---|---|---|
| 2016/0329367 A1* | 11/2016 | Komori | H10F 39/8063 |
| 2017/0062495 A1* | 3/2017 | Huang | H10F 39/014 |
| 2017/0148838 A1* | 5/2017 | Togashi | H10F 39/191 |
| 2017/0236854 A1* | 8/2017 | Lee | H10F 39/8067 |
| | | | 257/432 |
| 2018/0366508 A1* | 12/2018 | Goto | H10F 39/018 |
| 2019/0103433 A1* | 4/2019 | Yamashita | H10F 39/8067 |

* cited by examiner

CMOS IMAGING SENSOR STRUCTURE AND MANUFACTURING METHOD THEREFOR

CROSS-REFERENCE TO RELATED APPLICATION

This application claims priority of International Patent Application Serial No. PCT/CN2019/110938, filed Oct. 14, 2019, which is related to and claims priority of Chinese Patent Application Serial No. CN 201910133346.1, filed Feb. 22, 2019 and Chinese Patent Application Serial No. CN 201910183135.9, filed Mar. 12, 2019. The entirety of each of the above-mentioned patent applications is hereby incorporated herein by reference and made a part of this specification.

TECHNICAL FIELD

The disclosure relates to the technical field of semiconductor integrated circuit manufacturing, in particular to a CMOS imaging sensor structure and a manufacturing method thereof.

BACKGROUND

In pixels of a traditional CMOS imaging sensor, a circuit device region and a photosensitive region are usually arranged side by side in a horizontal direction. Wherein, the photosensitive region is used for receiving external lights and generating an electrical signal; the circuit device region is mainly a circuit formed by a traditional CMOS device, and is used for leading out the electrical signal from the photosensitive region.

Since the above circuit device region occupies a part of areas of the pixels, photosensitive effect of the pixels is influenced, that is, a fill factor of the pixels is reduced.

SUMMARY

In order to overcome above problems, the present invention provides a CMOS imaging sensor structure and a manufacturing method thereof.

In order to achieve above objectives, the present invention provides a CMOS imaging sensor structure, comprising: a pixel unit of the CMOS imaging sensor set on a semiconductor substrate, the pixel unit comprises a circuit device region and a first photosensitive region, the circuit device region is set on the frontside of the semiconductor substrate, the first photosensitive region is set correspondingly in the semiconductor substrate below the circuit device region, the circuit device region is isolated from the first photosensitive region by an isolation region, and the circuit device region is electrical connected with the first photosensitive region through a conductive trench.

Further, the semiconductor substrate is an SOI substrate, and the SOI substrate comprises a silicon substrate layer, a buried oxygen layer, and an epitaxial silicon layer sequentially, and the CMOS imaging sensor comprises:

the circuit device region set on the epitaxial silicon layer and the first photosensitive region set on the silicon substrate layer; the circuit device region is isolated from the first photosensitive region by the buried oxygen layer, and the circuit device region is electrical connected with the first photosensitive region through a conductive trench passing through the buried oxide layer;

each of pixels of the CMOS imaging sensor is set with the circuit device region and the first photosensitive region, the circuit device region and the first photosensitive region are set on the epitaxial silicon layer and the silicon substrate layer respectively, upper and lower positions of the circuit device region and the first photosensitive region are corresponding;

each of the pixels of the CMOS imaging sensor is isolated by a shallow trench isolation structure.

Further, the shallow trench isolation structure comprises a first shallow trench isolation structure set on the epitaxial silicon layer and a second shallow trench isolation structure set on the silicon substrate layer.

Further, the end of the first shallow trench isolation structure and the end of the second shallow trench isolation structure are connected together with the buried oxide layer, and other ends are exposed on surface of the epitaxial silicon layer and surface of the silicon substrate layer respectively.

Further, the conductive trench passes through the buried oxide layer from the surface of the epitaxial silicon layer, and stops in the silicon substrate layer, and the conductive trench is connected with the circuit device region through a part of the conductive trench located in the epitaxial silicon layer, and connected with the first photosensitive region through a part of the conductive trench located in the silicon substrate layer.

Further, the conductive trench is a metal conductive trench filled with a metal or a polysilicon conductive trench filled with polysilicon.

Further, a metal silicide layer and a metal nitride layer are formed sequentially on inner walls of the metal conductive trench, and the metal conductive trench on the metal nitride layer is filled with an electrode metal.

Further, the metal silicide layer is a titanium silicide layer or a tantalum silicide layer formed by a heating treatment of titanium or tantalum deposited on the inner walls of the metal conductive trench with silicon in the epitaxial silicon layer and the silicon substrate layer.

Further, the pixel unit is further set with a second photosensitive region, the second photosensitive region and the circuit device region are set on the frontside of the semiconductor substrate side by side; the first photosensitive region is connected with the circuit device region located above and the second photosensitive region located beside the conductive trench;

wherein, the circuit device region is isolated from the first photosensitive region located below through the isolation region, the periphery of the circuit device region and the second photosensitive region is set with a deep trench isolation structure to realize isolation between the pixels, upper and lower surfaces of the deep trench structure are exposed from the frontside and backside of the semiconductor substrate respectively;

wherein, a metal interconnection layer is set on the frontside of the semiconductor substrate, and lights are incident on the backside of the semiconductor substrate.

Further, the first photosensitive region is formed with a first photosensitive PN device, the second photosensitive region is formed with a second photosensitive PN device, and the circuit device region is formed with a plurality of circuit devices, the first photosensitive PN device and the second photosensitive PN device are connected with a source/drain region of a corresponding circuit device in the circuit device region though the conductive trench.

Further, wherein the conductive trench is located in the semiconductor substrate, upper surface and lower surface of the conductive trench are contacted with the second photosensitive PN device and the first photosensitive PN device respectively.

Further, the conductive trench is filled with doped conductive polysilicon and performed with a diffusion treatment.

Further, the isolation region is an oxygen ion implanting isolation layer.

Further, the lower surface of the deep trench isolation structure is exposed by thinning the backside of the semiconductor substrate.

Further, the circuit device is a MOS transistor.

Further, the metal interconnection layer is set in an interlayer dielectric layer on the frontside of the semiconductor substrate, and surface of the interlayer dielectric layer is set with a PAD layer connected with the metal interconnection layer.

In order to achieve above objectives, the present invention also provides a manufacturing method for a CMOS imaging sensor structure, comprising following steps:
  providing an SOI substrate, which comprises a silicon substrate layer, a buried oxygen layer and an epitaxial silicon layer sequentially;
  forming a first shallow trench isolation structure on the epitaxial silicon layer for isolating each of pixels of the CMOS imaging sensor, exposing upper surface of the first shallow trench isolation structure on surface of the epitaxial silicon layer, and connecting lower surface of the first shallow trench isolation structure with the buried oxygen layer;
  forming a conductive trench in each of the pixels, which passing through the buried oxide layer from the surface of the epitaxial silicon layer and stopping in the silicon substrate layer;
  forming a circuit device region for each of the pixels on the epitaxial silicon layer, and connecting the circuit device region with a part of the conductive trench in the epitaxial silicon layer;
  inverting the SOI substrate and thinning the silicon substrate layer;
  forming a second shallow trench isolation structure for isolating each of the pixels of the CMOS imaging sensor on the thinned silicon substrate layer, exposing upper surface of the second shallow trench isolation structure on surface of the silicon substrate layer, and connecting lower surface of the second shallow trench isolation structure with the buried oxygen layer;
  forming a first photosensitive for each of the pixels on the silicon substrate layer by an implantation process, and connecting the first photosensitive region with a part of the conductive trench located in the silicon substrate layer Further, forming the conductive trench comprises following steps specifically:
  forming a trench, which passing through the buried oxygen layer form the surface of the epitaxial silicon layer and stopping in the silicon substrate layer;
  forming a titanium layer or a tantalum layer on inner walls of the trench by a deposition process;
  forming a titanium nitride layer or a tantalum nitride layer on the titanium layer or the tantalum layer by a deposition process;
  filling tungsten or copper in the trench on the titanium nitride layer or the tantalum nitride layer to serve as an electrode metal;
  performing a heating treatment to above layers formed to make the titanium layer or the tantalum layer material reacted with silicon in the epitaxial silicon layer and the silicon substrate layer, then forming a titanium silicide layer or a tantalum silicide layer on the inner walls of the trench to form a metal conductive trench.

Further, forming the conductive trench comprises following steps specifically:
  forming a trench, which passing through the buried oxygen layer form the surface of the epitaxial silicon layer and stopping in the silicon substrate layer;
  depositing polysilicon in the trench to form a polysilicon conductive trench.

In order to achieve above objectives, the present invention also provides a manufacturing method for a CMOS imaging sensor structure, comprising following steps:
  providing a semiconductor substrate, and forming a deep trench isolation structure on the frontside of the semiconductor substrate for isolating pixels;
  forming a trench using for conducting on the frontside of the semiconductor substrate within the deep trench isolation;
  forming a second photosensitive region on the frontside of the substrate on one side of the trench, which comprises forming a second photosensitive PN device, and forming a first photosensitive region in the semiconductor substrate below a circuit device region on the other side of the trench, which comprises forming a first photosensitive PN device;
  forming an isolation region above the first photosensitive region;
  filling the trench with doped conductive polysilicon, and performing a diffusion treatment to form a conductive trench, the first photosensitive PN device is connected with the second photosensitive PN device though the conductive trench;
  forming a circuit device region on the frontside of the semiconductor substrate above the isolation region, which comprises forming gates and source/drain regions of a plurality of circuit devices in the circuit device region, and connecting a source/drain region of a corresponding circuit device with the conductive trench;
  forming an interlayer dielectric layer on the frontside of the semiconductor substrate, and forming a metal interconnection layer in the interlayer dielectric layer, and forming a PAD layer connected with the metal interconnection layer on surface of the interlayer dielectric layer;
  performing a thinning process to the backside of the semiconductor substrate and stopping at the bottom of the deep trench isolation structure, which exposes the first photosensitive region and the second photosensitive region on the backside of the semiconductor substrate.

Further, implanting the semiconductor substrate with different kinds and different types of ions several times downwards from the frontside of the semiconductor substrate, forming the second photosensitive PN device located in the second photosensitive region, and the isolation region and the first photosensitive PN device located in the circuit device region in the semiconductor substrate from top to bottom respectively.

It can be seen from the above technical solutions that, on one hand, the present invention makes full use of an advantage that the SOI substrate is isolated into a substrate with frontside and backside by an oxide, realizes the circuit region by a standard CMOS process on the frontside of epitaxial silicon layer, and realizes the photosensitive region (the first photosensitive region) by implanting on the backside, which can increase fill factor of the photosensitive region simultaneously, and since the epitaxial silicon layer on the frontside of the substrate can be used for circuit design, more optimized design scheme can be used for improving performances of a reading circuit without being restricted by area as a traditional architecture, so as to improve performances of an overall chip. On another hand, the present invention uses a frontside photosensitive CMOS imaging sensor technology, in addition to form a photosensitive region (the second photosensitive region) on a side of the circuit device region in a pixel in a conventional manner, it also forms a photosensitive region (the first photosensitive region) below the circuit device region in the pixel, and a SIMOX isolation region is formed by an oxygen ion implanting process, and the first photosensitive region is formed below the SIMOX isolation region by an implanting process, so as to isolate the circuit device region from the first photosensitive region below; and after a trench etching on the frontside, polysilicon is filled and then performing the diffusion treatment to connect the second photosensitive region next to the circuit device region with the first photosensitive region below the circuit device region together, and connect with source and drain ends of a certain circuit device; two adjacent pixels are isolated from each other by a deep trench isolation, the deep trench isolation is formed by a silicon wafer frontside process, the depth of the deep trench isolation is controlled inside the substrate, and the lower surface of the semiconductor substrate is pushed to the bottom of the deep trench isolation by a backside thinning process. In this way, based on an original CMOS imaging sensor chip, a larger photosensitive area can be formed, product performances can be improved, and it can be compatible with a CMOS frontside process without using special equipments, so as to reduce production difficulty and reduce costs effectively

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

The present invention provides a CMOS imaging sensor structure, comprising: a pixel unit of the CMOS imaging sensor set on a semiconductor substrate, the pixel unit comprises a circuit device region and a first photosensitive region, the circuit device region is set on the frontside of the semiconductor substrate, the first photosensitive region is set correspondingly in the semiconductor substrate below the circuit device region, the circuit device region is isolated from the first photosensitive region by an isolation region, and the circuit device region is electrical connected with the first photosensitive region through a conductive trench.

The content of the present invention will be further described in detail below in conjunction with accompanying drawings of the specification. It should be understood that the present invention can have various changes in different embodiments, which do not depart from scope of the present invention, and descriptions and diagrams therein are essentially for illustrative purposes rather than limiting the present invention. It should be noted that the drawings all adopt a very simplified form and all use an imprecise ratio, which is only used to conveniently and clearly assist in explaining purposes of the embodiments of the present invention.

Figure 1:
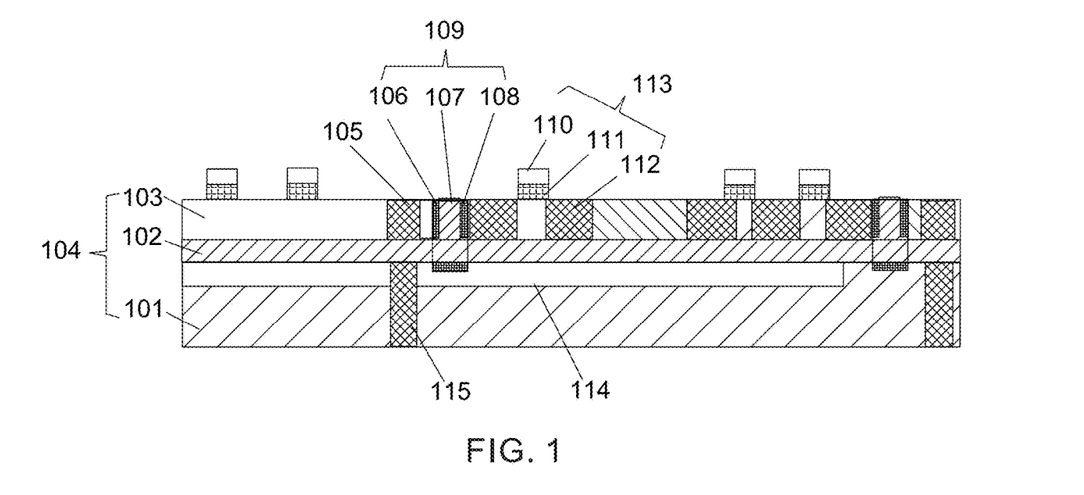
FIG. 1 is a schematic diagram of a CMOS imaging sensor structure according to a first preferred embodiment of the present invention.

Please refer to FIG. 1. In an embodiment, the present invention provides a CMOS imaging sensor structure with a high fill factor. The CMOS imaging sensor structure of the present invention can be set on an SOI substrate 104. Wherein, the SOI substrate 104 can comprise a silicon substrate layer 101 located on the backside (reverse side), an epitaxial silicon layer 103 located on the frontside (obverse side), and a buried oxide layer (silicon dioxide layer) 102 located between the silicon substrate layer 101 and the epitaxial silicon layer 103 for isolating the silicon substrate layer 101 and the epitaxial silicon layer 103.

The CMOS imaging sensor structure can comprise a circuit device region in each of pixels of the CMOS imaging sensor set on the epitaxial silicon layer 103 and a first photosensitive region in each of the pixels of the CMOS imaging sensor set on the silicon substrate layer 101.

Each of the pixels of the CMOS imaging sensor comprises the circuit device region and the first photosensitive region, the circuit device region and the first photosensitive region are set on the epitaxial silicon layer 103 and the silicon substrate layer 101 respectively, upper and lower positions of the circuit device region and the first photosensitive region are corresponding.

The circuit device region is set with a plurality of circuit devices; the circuit devices can comprise various transistors such as a transfer transistor 113 required by a readout circuit. Wherein, each of the transistors can comprise a gate dielectric 111 and a gate electrode 110 set on surface of the epitaxial silicon layer 103, and a source/drain region (a source region and a drain region, S/D) 112 in the epitaxial silicon layer 103 located on two sides of the gate dielectric 111 and the gate electrode 110.

The first photosensitive region is set with a first photosensitive PN device 114; the first photosensitive PN device 114 can be formed by an implanting process.

The present invention makes full use of an advantage that the SOI substrate is isolated into a substrate with frontside and backside by an oxide, by setting the circuit device region of each of the pixels of the CMOS imaging sensor on the epitaxial silicon layer 103, and setting the first photosensitive region on the silicon substrate layer 101, the fill factor of the first photosensitive region can be increased significantly, and the epitaxial silicon layer 103 can be used completely for circuit design, thus a more optimized design scheme can be used for improving performances of the reading circuit.

Please refer to FIG. 1. Between the circuit device region and the first photosensitive region in each of the pixels, a conductive trench 109 passing through the buried oxide layer 102 (refers to a conductive trench 109 on a left side in FIG. 1, wherein the conductive trench 109 is equivalent to a through hole 9 in the Chinese patent application with application number CN 201910133346.1. A conductive trench is also shown on a right side in FIG. 1, which is used to connect the circuit device region with the silicon substrate layer 101 for grounding, the function of the conductive trench on the right side is different from the conductive trench 109 on the left side in FIG. 1, a contact region between the silicon substrate layer 101 and the conductive trench on the right side is a closed region with a certain area, which is only used to realize connection with the conductive trench, thus the smaller the area of the enclosed region, the better) can be used for electrical connecting.

The buried oxide layer 102 of the SOI substrate 104 is used as an isolation region for isolating the circuit device region from the first photosensitive region.

Each of the pixels of the CMOS imaging sensor is isolated by shallow trench isolation structures (STI) 105, 115. The shallow trench isolation structures 105, 115 can comprise a first shallow trench isolation structure 105 set on the epitaxial silicon layer 103 and a second shallow trench isolation structure 115 set on the silicon substrate layer 101. Wherein, upper surface of the first shallow trench isolation structure 105 shown in FIG. 1 can be exposed on upper surface of the epitaxial silicon layer 103 and flush with the upper surface of the epitaxial silicon layer 103, and lower surface of the first shallow trench isolation structure 105 is connected with upper surface of the buried oxygen layers 102. lower surface of the second shallow trench isolation structure 115 can be exposed on lower surface of the silicon substrate layer 101 and flush with lower surface of the silicon substrate layer 101, and upper surface of the second shallow trench isolation structure 115 is connected with lower surface of the buried oxygen layers 102.

Upper and lower positions of the first shallow trench isolation structure 105 and the second shallow trench isolation structure 115 can be set correspondingly. In addition, the first shallow trench isolation structure 105 and the second shallow trench isolation structure 115 can be in a form of a ring or a polygon, which surrounds each of the pixels to isolate each of the pixels completely.

Please continue to refer to FIG. 1. The conductive trench 109 is set to pass through the buried oxide layer 102 from the upper surface of the epitaxial silicon layer 103 and stop in the silicon substrate layer 101. Wherein, the conductive trench 109 can connect with the circuit device region through a part of the conductive trench 109 located in the epitaxial silicon layer 103; specifically, electrical connection can be realized between a source/drain region 112 of a transfer transistor 113 and the conductive trench 109. Meanwhile, the conductive trench 109 is connected with a first photosensitive PN device 114 in the first photosensitive region through a part of the conductive trench 109 located in the silicon substrate layer 101.

As an alternative embodiment, the conductive trench 109 can be a metal conductive trench 109 filled with a metal. Alternatively, the conductive trench 109 can also be a polysilicon conductive trench filled with polysilicon.

If the conductive trench 109 is set as the metal conductive trench 109 filled with the metal, a metal silicide layer 106 and a metal nitride layer 108 can be formed sequentially on inner walls of the metal conductive trench 109, and the metal conductive trench 109 on the metal nitride layer 108 is filled with an electrode metal 107. For example, the metal silicide layer 106 can be a titanium silicide layer or a tantalum silicide layer; the metal nitride layer 108 can be a titanium nitride layer or a tantalum nitride layer; the electrode metal 107 can be tungsten or copper, etc.

Wherein, the above-mentioned titanium silicide layer or tantalum silicide layer 106 is formed by depositing titanium or tantalum on the inner walls of the metal conductive trench 109 and reacting with silicon in the epitaxial silicon layer 103 and the underlying silicon layer 101 by a heating treatment under a certain temperature.

Hereinafter, a manufacturing method of the above-mentioned CMOS imaging sensor structure with the high fill factor of the present invention will be described in details through specific embodiments and in conjunction with FIG. 1.

Please refer to FIG. 1. The manufacturing method of the CMOS imaging sensor structure of the present invention can comprise following steps:

First, the SOI substrate 104 is used for fabricating the CMOS imaging sensor structure with the high fill factor of the present invention. The SOI substrate 104 comprises the silicon substrate layer 101, the buried oxide layer 102, and the epitaxial silicon layer 103 sequentially from bottom to top.

Then, a standard CMOS process can be performed to form the first shallow trench isolation structure 105 on the epitaxial silicon layer 103 for isolating each of the pixels of the CMOS imaging sensor, the upper surface of the first shallow trench isolation structure 105 is exposed on the surface of the epitaxial silicon layer 103, and the lower surface of the first shallow trench isolation structure 105 is connected with the upper surface of the buried oxide layer 102.

Next, forming the conductive trench 109, which passing through the buried oxide layer 102 from the upper surface of the epitaxial silicon layer 103 and stopping in the silicon substrate layer 101. The conductive trench 109 formed can be the metal conductive trench 109 filled with the metal, or the polysilicon conductive trench filled with polysilicon.

Wherein, if the metal conductive trench 109 is formed, as shown in FIG. 1, the manufacturing method can comprise following steps specifically:

First, a standard CMOS process can be used to form a trench passing through the buried oxide layer 102 from the upper surface of the epitaxial silicon layer 103 and stopping in the silicon substrate layer 101.

Then, a metal material such as titanium or tantalum is deposited on the entire inner walls surfaces of bottom and sides of the trench to form a titanium layer or a tantalum layer.

Next, a material such as titanium nitride or tantalum nitride is further deposited on the titanium layer or the tantalum layer to form a titanium nitride layer or tantalum nitride layer 108.

Then, filling the electrode metal 107 such as tungsten or copper on the titanium nitride layer or the tantalum nitride layer 108 in the remaining space of the trench.

Finally, performing the heating treatment to the above layers formed, by a reaction principle that a metal such as titanium or tantalum can form silicides with silicon at a certain temperature, the metal material such as titanium or tantalum is reacted with silicon in the epitaxial silicon layer 103 and the silicon substrate layer 101, then the titanium silicide layer or the tantalum silicide layer 106 is formed on the inner walls of the trench, so as to realize good electrical connection between bottom of the conductive trench 109 and the first photosensitive region; meanwhile, the silicide 106 is also formed on the upper part of the conductive trench 109 contacted with the epitaxial silicon layer 103, which can enhance electrical connection effect with the circuit device region.

If it is necessary to form the polysilicon conductive trench, the trench can be formed to pass through the buried oxide layer 102 from the upper surface of the epitaxial silicon layer 103 and stop in the silicon substrate layer 101. Then, polysilicon is deposited in the trench to form the polysilicon conductive trench.

Please continue to refer to FIG. 1. After forming the conductive trench 109 completely, the circuit device regions of each of the pixels can be formed continuously on the epitaxial silicon layer 103, which comprises using a standard CMOS technology to form transistor structures such as the transfer transistors 113 required for the readout circuit. Wherein, forming each of the transfer transistors 113 can comprise forming the gate dielectric 111 and the gate electrode 110 on the surface of the epitaxial silicon layer 103, and forming the source/drain region (the source and drain regions, S/D) in the epitaxial silicon layer 103 on the two sides of the gate dielectric 111 and the gate electrode 110. Layout design can be used for connecting the circuit device region with a part of the conductive trench 109 in the epitaxial silicon layer 103; For example, the electrical connection between the source/drain region 112 of a transfer transistor 113 and the sidewalls of the conductive trench 109 as shown in FIG. 1.

Next, inverting the SOI substrate 104 to make the silicon substrate layer 101 faces upward. Then, a standard CMOS process can be used for thinning the silicon substrate layer 101.

Next, on the thinned silicon substrate layer 101, a standard CMOS process can be used for forming the second shallow trench isolation structure 115 for isolating each of the pixels of the CMOS imaging sensor, the upper surface of the second shallow trench isolation structure 115 is exposed on the upper surface of the silicon substrate layer 101, and the lower surface of the second shallow trench isolation structure 115 is connected with the buried oxide layer 102. During a manufacturing process, the second shallow trench isolation structure 115 can be aligned with the first shallow trench isolation structure 105.

Finally, by a standard CMOS process, the silicon substrate layer 101 is implanted to form the first photosensitive region of each of the pixels, that is, the first photosensitive PN device 114 is formed in the first photosensitive region, and is connected with the bottom of the conductive trench 109, so as to realize the good electrical connection.

Next, a standard CMOS processes can also be used for forming other device structures of the CMOS imaging sensor sequentially, such as a filter layer and microlenses.

Figure 2:
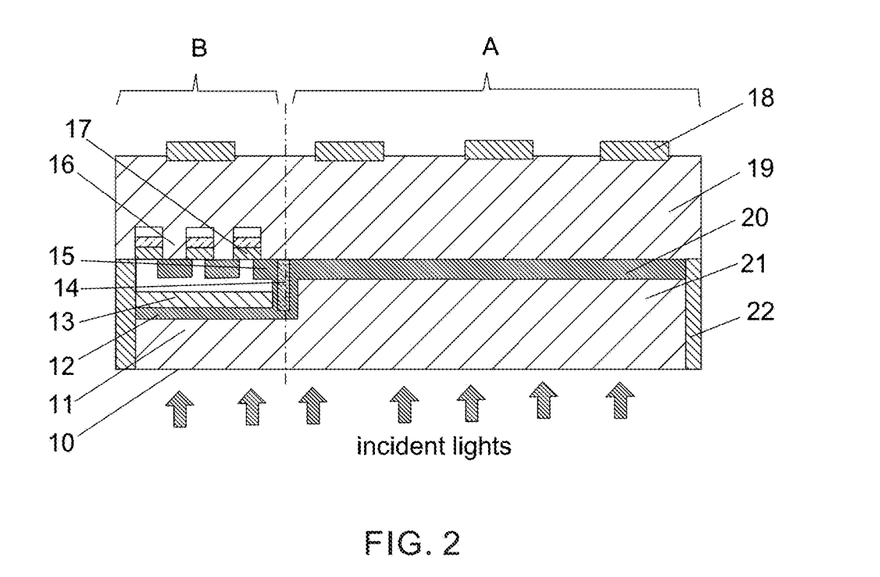
FIG. 2 is a schematic diagram of a CMOS imaging sensor structure according to a second preferred embodiment of the present invention.

Please refer to FIG. 2. In an embodiment, the present invention also provides a high-performance CMOS imaging sensor structure, each of pixels comprises: a second photosensitive region A and a circuit device region B are set on frontside of a semiconductor substrate 10 side by side. The semiconductor substrate 10 in the embodiment adopts a bulk silicon substrate, which is different from the previous embodiment, wherein, the second photosensitive region A is a conventionally region used for setting photosensitive devices in each of the pixels; the circuit device region B is a conventionally region used for setting CMOS circuit devices in each of the pixels; the circuit device region B can be set with a plurality of circuit devices 16, and the circuit devices 16 can adopt conventionally MOS transistors to realize selection and reset of the photosensitive devices, and storage, amplification and readout of control signals.

Please refer to FIG. 2. Each of the circuit devices 16 can comprise a gate structure 17 set on the frontside of the semiconductor substrate 10; the gate structure 17 can adopt a multi-layer laminated structure. A source region and a drain region 15 are set in the semiconductor substrate 10 on two sides of the gate structure 17. More knowledges about the circuit device region B and the corresponding circuit devices 16 can be understood with references to the prior art.

Periphery of each of the pixels, which comprises the circuit device region B and the second photosensitive region A, is set with a deep trench isolation structure 22, so as to realize isolation between the pixels.

Please refer to FIG. 2. In the present invention, in the semiconductor substrate 10 below the circuit device region B, a first photosensitive region is also set, which is used for setting a CMOS photosensitive device. The first photosensitive region in FIG. 2 is equivalent to the first photosensitive region in the embodiment of FIG. 1. Wherein, the second photosensitive region A is formed with a second photosensitive PN device (a photosensitive PN junction) 20, 21, and the first photosensitive region is formed with a first photosensitive PN device (a photosensitive PN junction) 12, 11. The first photosensitive region is connected simultaneously with the circuit devices 16 in the circuit device region B above the first photosensitive region and the second photosensitive region A next to the circuit device region B through a conductive trench 14. Specifically, the second photosensitive PN devices 20, 21 and the first photosensitive PN devices 12, 11 can be connected with the source region or the drain region 15 of a corresponding circuit device 16 in the circuit device region B through the conductive trench 14.

In this way, based on an original CMOS imaging sensor chip, a larger photosensitive region can be formed and product performance can be improved.

The conductive trench 14 enters the semiconductor substrate 10 downward from the frontside of the semiconductor substrate 10; upper surface and lower surface of the conductive trench 14 are contacted with the second photosensitive PN devices 20, 21 and the first photosensitive PN devices 12, 11 respectively. For example, the upper surface (upperside) of the conductive trench 14 can be connected with n(p) device end 20 of the second photosensitive PN device 20, 21, and the lower surface of the conductive trench 14 can be connected with n(p) device end 12 of the first photosensitive PN device 12, 11; the upper surface (upperside) of the conductive trench 14 is also connected simultaneously with an n(p) source region or a drain region 15 corresponding to the circuit device 16. In this way, the second photosensitive PN devices 20, 21, the first photosensitive PN devices 12, 11 and the circuit device 16 can be electrically connected through the conductive trench 14.

The conductive trench 14 can be filled with doped conductive polysilicon and performed with a diffusion treatment to enhance an electrical connection effect between the conductive trench 14, the second photosensitive PN devices 20, 21, the first photosensitive PN devices 12, 11 and the circuit device 16. Doping type of the doped conductive polysilicon in the conductive trench 14 is the same as doping type of the n(p) device ends 20 and 12 of the second photosensitive PN devices 20, 21 and the first photosensitive PN devices 12, 11, and the n(p) source region or the n(p) drain region 15 of the circuit device 16.

Figure 3:
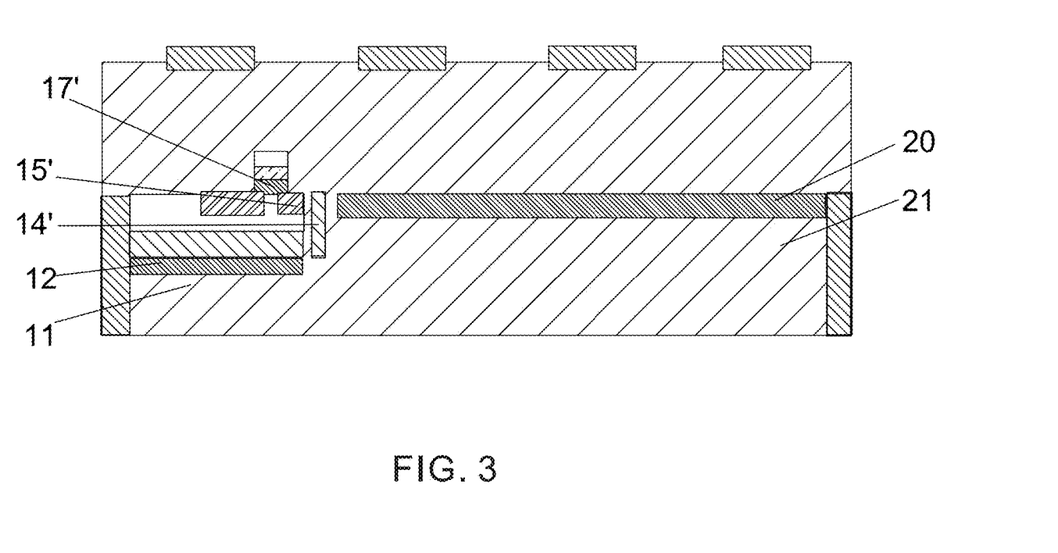
FIG. 3 is a schematic diagram of a CMOS imaging sensor structure according to a third preferred embodiment of the present invention.

Please refer to FIG. 3, which shows another side of the photosensitive PN junction in FIG. 2. Electrical connection between other sides of the second photosensitive PN devices 20, 21 and the first photosensitive PN devices 12, 11 can be realized through a conductive trench 14'. That is, upper surface (upperside) of the conductive trench 14' can be connected simultaneously with the p(n) device end 21 of the second photosensitive PN device 20, 21 and an p(n) source region or a drain region 15' corresponding to a circuit device 16, and lower surface of the conductive trench 14' is connected with the p(n) device end 11 of the first photosensitive PN device 12, 11. Wherein, the conductive trench 14' is isolated from the n(p) device ends 20 and 12 of the second photosensitive PN devices 20, 21 and the first photosensitive PN devices 12, 11.

Please continue to refer to FIG. 2. The circuit device region B is isolated from the first photosensitive region located below the circuit device region B by an isolation region 13. The isolation region 13 can be a SIMOX isolation layer 13 formed by an oxygen ion implantation isolation method (SIMOX). The present invention is not limited to this.

Please refer to FIG. 2. Upper and lower surfaces of the deep trench isolation structure 22 are exposed respectively from the frontside and backside of the semiconductor substrate 10. Wherein, the opening of the original deep trench isolation structure 22 is set on the frontside of the semiconductor substrate 10, and the original deep trench isolation structure 22 enters the interior of the semiconductor substrate 10 downward, that is, bottom of the deep trench isolation structure 22 is located not lower than or close to positions of bottom ends of the second photosensitive PN devices 20, 21 and the first photosensitive PN devices 12, 11 (that is, the p(n) device end 21 of the second photosensitive PN devices 20, 21 and the p(n) device end 11 of the first photosensitive PN devices 12, 11). Then, by thinning the backside of the semiconductor substrate 10, the bottom of the deep trench isolation structure 22 is exposed on the backside of the semiconductor substrate 10, and the bottom ends of the second photosensitive PN devices 20, 21 and the first photosensitive PN devices 12, 11 are also exposed (or close to) the backside of the semiconductor substrate 10. This not only achieves good isolation of the devices and enhances a backside light-sensing effect, but also reduces process difficulty.

Please continue to refer to FIG. 2. An interlayer dielectric layer 19 is also set on the frontside of the semiconductor substrate 10. A metal interconnection layer is set in the interlayer dielectric layer 19; a PAD layer 18 is also set on surface of the interlayer dielectric layer 19. The PAD layer 18 is connected with the metal interconnection layer.

When the CMOS imaging sensor manufactured by the high-performance CMOS imaging sensor structure of the present invention is used, the backside of the semiconductor substrate 10 is used as incident surface (an photosensitive surface) of external lights, that is, the external lights enters the CMOS imaging sensor from the backside of the semiconductor substrate 10. Then, almost entire area of a pixel can be used for forming the photosensitive surface, so as to improve fill factor of the pixel significantly, avoid a usual backside process and reduce cost greatly.

The manufacturing method for the above-mentioned high-performance CMOS imaging sensor structure of the present invention is described in details below through a specific implementation in conjunction with FIG. 2 (FIG. 3).

The manufacturing method of a high-performance CMOS imaging sensor structure of the present invention can be used to manufacture the high-performance CMOS imaging sensor structure exemplified in FIG. 2 (FIG. 3), and can comprise following steps:

First, though a wafer frontside process, a photolithography process and an etching process are used for forming the deep trench isolation structure 22 for isolating the pixels on frontside of the semiconductor substrate 10 For example. The depth of the deep trench structure 22 is controlled inside the semiconductor substrate 10 and the deep trench structure 22 is filled with a dielectric material.

Secondly, on the frontside of the semiconductor substrate 10 within the deep trench isolation structure 22, a trench used for conducting is formed by a photolithography process and an etching process. Two sides of the trench are used for forming the second photosensitive region A and the circuit device region B of the pixel respectively.

Next, on the frontside of the semiconductor substrate 10 beside a side of the trench, a conventional implanting process can be used for forming the second photosensitive region A, which comprises forming the second photosensitive PN devices 20, 21. At a predetermined depth position in the semiconductor substrate 10 below the circuit device region B beside another side of the trench, an implanting process can be used for forming the first photosensitive region, which comprises forming the first photosensitive PN devices 12, 11.

Then, above the first photosensitive region, a SIMOX isolation region (the SIMOX isolation layer) 13 can be formed by an oxygen ion implanting process, so as to isolate the first photosensitive PN devices 12, 11 from the circuit device 16 fabricated later.

When forming the second photosensitive PN devices 20, 21, the first photosensitive PN devices 12, 11 and the SIMOX isolation region 13, the semiconductor substrate 10 can be implanted several times.

Then, the trench is filled with doped conductive polysilicon, and performed a diffusion process to form the conductive trench 14 (14'). Doping type of the doped conductive polysilicon is consistent with doping type of the n(p) device ends 20, 12 (p(n) device ends 21, 11) of the second photosensitive PN devices 20, 21 and the first photosensitive PN devices 12, 11. After the diffusion process, the second photosensitive PN device 20, 21 is connected with the first photosensitive PN device 12, 11 through the conductive trench 14 (14').

Next, on the frontside of the semiconductor substrate 10 above the isolation region 13, a conventional CMOS process is used for forming the circuit device region B, which comprises forming gates 17 (17') and corresponding source/drain regions 15 (15') of a plurality of the circuit devices 16 (such as a transmission tube, a reset tube, a source follower tube, Etc.) in the circuit device region B, and n(p) source/drain regions 15 of the corresponding circuit devices 16 is connected with the conductive trench 14; Doping type of the n(p) source/drain region 15 of the corresponding circuit device 16 is consistent with doping type of the n(p) device ends 20, 12 of the second photosensitive PN devices 20, 21 and the first photosensitive PN devices 12, 11. N(p) source/drain region 15' of another corresponding circuit devices 16 is connected with the conductive trench 14'; Doping type of the n(p) source/drain region 15' of the corresponding circuit device 16 is consistent with doping type of the p(n) device ends 21,11 of the second photosensitive PN devices 20, 21 and the first photosensitive PN devices 12, 11.

Next, the interlayer dielectric layer 19 is deposited on the frontside of the semiconductor substrate 10, and a metal interconnection process is used for forming the metal interconnection layer in the interlayer dielectric layer 19, the PAD layer 18 is forming on surface of the interlayer dielectric layer 19 to connect with the metal interconnection layer.

Then, inverting the semiconductor substrate 10 and performing a thinning process to the backside of the semiconductor substrate 10. The thinning process is stopped at the bottom of the deep trench isolation structure 22, that is, the backside of the semiconductor substrate 10 is flushed with the bottom of the deep trench isolation 22, then the second photosensitive region A and the first photosensitive region are exposed to (or close to) the backside of the semiconductor substrate 10.

Finally, other structures, such as a filter layer and microlens of the CMOS imaging sensor can be further manufactured.

The above descriptions are only the preferred embodiments of the present invention, and the described embodiments are not used to limit the scope of patent protection of the present invention. Therefore, any equivalent structural changes made using the contents of the description and drawings of the present invention should be included in the same reasoning. Within the protection scope of the appended claims of the present invention.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A CMOS imaging sensor structure, comprising: a pixel unit of the CMOS imaging sensor set on a semiconductor substrate, the pixel unit comprises a circuit device region and a first photosensitive region, the circuit device region is set on the frontside of the semiconductor substrate, the first photosensitive region is set correspondingly in the semiconductor substrate below the circuit device region, the circuit device region is isolated from the first photosensitive region by an isolation region, and the circuit device region is electrically connected with the first photosensitive region through a conductive trench;

wherein, the semiconductor substrate is an SOI substrate, and the SOI substrate comprises a silicon substrate layer, a buried oxygen layer, and an epitaxial silicon layer sequentially, and the CMOS imaging sensor comprises:

the circuit device region set on the epitaxial silicon layer and the first photosensitive region set on the silicon substrate layer; the circuit device region is isolated from the first photosensitive region by the buried oxygen layer, and the circuit device region is electrically connected with the first photosensitive region through a conductive trench passing through the buried oxide layer;

each of pixels of the CMOS imaging sensor is set with the circuit device region and the first photosensitive region, the circuit device region and the first photosensitive region are set on the epitaxial silicon layer and the silicon substrate layer respectively, upper and lower positions of the circuit device region and the first photosensitive region are corresponding;

each of the pixels of the CMOS imaging sensor is isolated by a shallow trench isolation structure.

2. The CMOS imaging sensor structure of claim 1, wherein, the shallow trench isolation structure comprises a first shallow trench isolation structure set on the epitaxial silicon layer and a second shallow trench isolation structure set on the silicon substrate layer.

3. The CMOS imaging sensor structure of claim 2, wherein, the end of the first shallow trench isolation structure and the end of the second shallow trench isolation structure are connected together with the buried oxide layer, and other ends are exposed on a surface of the epitaxial silicon layer and a surface of the silicon substrate layer respectively.

4. The CMOS imaging sensor structure of claim 1, wherein, the conductive trench passes through the buried oxide layer from the surface of the epitaxial silicon layer, and stops in the silicon substrate layer, and the conductive trench is connected with the circuit device region through a part of the conductive trench located in the epitaxial silicon layer, and connected with the first photosensitive region through a part of the conductive trench located in the silicon substrate layer.

5. The CMOS imaging sensor structure of claim 1, wherein, the conductive trench is a metal conductive trench filled with a metal or a polysilicon conductive trench filled with polysilicon.

6. The CMOS imaging sensor structure of claim 5, wherein, a metal silicide layer and a metal nitride layer are formed sequentially on inner walls of the metal conductive trench, and the metal conductive trench on the metal nitride layer is filled with an electrode metal.

7. The CMOS imaging sensor structure of claim 6, wherein, the metal silicide layer is a titanium silicide layer or a tantalum silicide layer formed by a heating treatment of titanium or tantalum deposited on the inner walls of the metal conductive trench with silicon in the epitaxial silicon layer and the silicon substrate layer.

8. A CMOS imaging sensor structure, comprising: a pixel unit of the CMOS imaging sensor set on a semiconductor substrate, the pixel unit comprises a circuit device region and a first photosensitive region, the circuit device region is set on the frontside of the semiconductor substrate, the first photosensitive region is set correspondingly in the semiconductor substrate below the circuit device region, the circuit device region is isolated from the first photosensitive region by an isolation region, and the circuit device region is electrically connected with the first photosensitive region through a conductive trench;

wherein, the pixel unit is further set with a second photosensitive region, the second photosensitive region and the circuit device region are set on the frontside of the semiconductor substrate side by side; the first photosensitive region is connected with the circuit device region located above and the second photosensitive region located beside the conductive trench;

wherein, the circuit device region is isolated from the first photosensitive region located below through the isolation region, the periphery of the circuit device region and the second photosensitive region is set with a deep trench isolation structure to realize isolation between the pixels, upper and lower surfaces of the deep trench structure are exposed from the frontside and backside of the semiconductor substrate respectively;

wherein, a metal interconnection layer is set on the frontside of the semiconductor substrate, and lights are incident from the backside of the semiconductor substrate.

9. The CMOS imaging sensor structure of claim 8, wherein, the first photosensitive region is formed with a first photosensitive PN device, the second photosensitive region is formed with a second photosensitive PN device, and the circuit device region is formed with a plurality of circuit devices, the first photosensitive PN device and the second photosensitive PN device are connected with a source/drain region of a corresponding circuit device in the circuit device region though the conductive trench.

10. The CMOS imaging sensor structure of claim 9, wherein the conductive trench is located in the semiconductor substrate, upper surface and lower surface of the conductive trench are contacted with the second photosensitive PN device and the first photosensitive PN device respectively.

11. The CMOS imaging sensor structure of claim 8, wherein, the conductive trench is filled with doped conductive polysilicon and performed with a diffusion treatment; the isolation region is an oxygen ion implanting isolation layer.

12. The CMOS imaging sensor structure of claim 8, wherein, the lower surface of the deep trench isolation structure is exposed by thinning the backside of the semiconductor substrate.

13. The CMOS imaging sensor structure of claim 8, wherein, the circuit device is a MOS transistor.

14. The CMOS imaging sensor structure of claim 13, wherein, the metal interconnection layer is set in an interlayer dielectric layer on the frontside of the semiconductor substrate, and surface of the interlayer dielectric layer is set with a pad layer connected with the metal interconnection layer.

15. A manufacturing method for the CMOS imaging sensor structure according to claim 1, comprising following steps:
providing an SOI substrate, which comprises a silicon substrate layer, a buried oxygen layer and an epitaxial silicon layer sequentially;
forming a first shallow trench isolation structure on the epitaxial silicon layer for isolating each of pixels of the CMOS imaging sensor, exposing upper surface of the first shallow trench isolation structure on surface of the epitaxial silicon layer, and connecting lower surface of the first shallow trench isolation structure with the buried oxygen layer;
forming a conductive trench in each of the pixels, which passing through the buried oxide layer from the surface of the epitaxial silicon layer and stopping in the silicon substrate layer;
forming a circuit device region for each of the pixels on the epitaxial silicon layer, and connecting the circuit device region with a part of the conductive trench in the epitaxial silicon layer;
inverting the SOI substrate and thinning the silicon substrate layer;
forming a second shallow trench isolation structure for isolating each of the pixels of the CMOS imaging sensor on the thinned silicon substrate layer, exposing upper surface of the second shallow trench isolation structure on surface of the silicon substrate layer, and connecting lower surface of the second shallow trench isolation structure with the buried oxygen layer;
forming a first photosensitive for each of the pixels on the silicon substrate layer by an implantation process, and connecting the first photosensitive region with a part of the conductive trench located in the silicon substrate layer.

16. The manufacturing method of a CMOS imaging sensor structure of claim 15, wherein, forming the conductive trench comprises following steps specifically:
forming a trench, which passing through the buried oxygen layer form the surface of the epitaxial silicon layer and stopping in the silicon substrate layer;
forming a titanium layer or a tantalum layer on inner walls of the trench by a deposition process;
forming a titanium nitride layer or a tantalum nitride layer on the titanium layer or the tantalum layer by a deposition process;
filling tungsten or copper in the trench on the titanium nitride layer or the tantalum nitride layer to serve as an electrode metal;
performing a heating treatment to above layers formed to make the titanium layer or the tantalum layer material reacted with silicon in the epitaxial silicon layer and the silicon substrate layer, then forming a titanium silicide layer or a tantalum silicide layer on the inner walls of the trench to form a metal conductive trench.

17. The manufacturing method of a CMOS imaging sensor structure of claim 15, wherein, forming the conductive trench comprises following steps specifically:
forming a trench, which passing through the buried oxygen layer form the surface of the epitaxial silicon layer and stopping in the silicon substrate layer;
depositing polysilicon in the trench to form a polysilicon conductive trench.

18. A manufacturing method for the CMOS imaging sensor structure according to claim 1, comprising following steps:
providing a semiconductor substrate, and forming a deep trench isolation structure on the frontside of the semiconductor substrate for isolating pixels;
forming a trench using for conducting on the frontside of the semiconductor substrate within the deep trench isolation;
forming a second photosensitive region on the frontside of the semiconductor substrate on one side of the trench, which comprises forming a second photosensitive PN device, and forming a first photosensitive region in the semiconductor substrate below a circuit device region on the other side of the trench, which comprises forming a first photosensitive PN device;
forming an isolation region above the first photosensitive region;
filling the trench with doped conductive polysilicon, and performing a diffusion treatment to form a conductive trench, the first photosensitive PN device is connected with the second photosensitive PN device though the conductive trench;
forming a circuit device region on the frontside of the semiconductor substrate above the isolation region, which comprises forming gates and source/drain regions of a plurality of circuit devices in the circuit device region, and connecting a source/drain region of a corresponding circuit device with the conductive trench;
forming an interlayer dielectric layer on the frontside of the semiconductor substrate, and forming a metal interconnection layer in the interlayer dielectric layer, and forming a PAD layer connected with the metal interconnection layer on surface of the interlayer dielectric layer;
performing a thinning process to the backside of the semiconductor substrate and stopping at the bottom of the deep trench isolation structure, which exposes the first photosensitive region and the second photosensitive region on the backside of the semiconductor substrate.

19. The manufacturing method of a CMOS imaging sensor structure of claim 18, wherein, implanting the semiconductor substrate with different kinds and different types of ions several times downwards from the frontside of the semiconductor substrate, forming the second photosensitive PN device located in the second photosensitive region, and the isolation region and the first photosensitive PN device located in the circuit device region in the semiconductor substrate from top to bottom respectively.

\* \* \* \* \*